United States Patent
Tang et al.

(10) Patent No.: US 11,366,185 B2
(45) Date of Patent: Jun. 21, 2022

(54) ONLINE AUTOMATIC MEASUREMENT SYSTEM FOR INTEGRAL MAGNETIC PERFORMANCE OF CLAW POLE

(71) Applicants: JIANGSU LONGCHENG PRECISION FORGING GROUP CO., LTD., Changzhou (CN); UNIV SHANGHAI JIAOTONG, Shanghai (CN)

(72) Inventors: Xiaofeng Tang, Changzhou (CN); Chengliang Hu, Shanghai (CN); Minjun Tang, Changzhou (CN); Li Zhu, Changzhou (CN); Jinsheng Cheng, Changzhou (CN); Zhen Zhao, Shanghai (CN)

(73) Assignees: JIANGSU LONGCHENG PRECISION FORGING GROUP CO., LTD., Changzhou (CN); SHANGHAI JIAOTONG UNIVERSITY, Shanghai (CN)

( * ) Notice: Subject to any disclaimer, the term of this patent is extended or adjusted under 35 U.S.C. 154(b) by 356 days.

(21) Appl. No.: 16/645,879

(22) PCT Filed: Jul. 2, 2019

(86) PCT No.: PCT/CN2019/094315
§ 371 (c)(1),
(2) Date: Mar. 10, 2020

(87) PCT Pub. No.: WO2020/011060
PCT Pub. Date: Jan. 16, 2020

(65) Prior Publication Data
US 2020/0284858 A1 Sep. 10, 2020

(30) Foreign Application Priority Data

Jul. 13, 2018 (CN) .......................... 201810768917.4

(51) Int. Cl.
*G01R 33/12* (2006.01)
*B07C 5/344* (2006.01)

(52) U.S. Cl.
CPC .......... *G01R 33/1253* (2013.01); *B07C 5/344* (2013.01)

(58) Field of Classification Search
CPC .... G01R 33/1253; G01R 33/12; G01R 33/00; B07C 5/344; H02K 15/02; H02K 15/00
(Continued)

(56) References Cited

FOREIGN PATENT DOCUMENTS

| CN | 104515959 A | * | 4/2015 | ............. G01R 33/12 |
| WO | WO-2012061970 A1 | * | 5/2012 | ............. B07C 5/344 |

* cited by examiner

*Primary Examiner* — Jermele M Hollington
*Assistant Examiner* — Courtney G McDonnough
(74) *Attorney, Agent, or Firm* — CBM Patent Consulting, LLC

(57) ABSTRACT

An online automatic measurement system for a claw-pole overall magnetic property comprising: a feeding part, a claw-pole overall magnetic property measurement unit, and a discharging part disposed in sequence, and a robotic arm disposed there among. The robotic arm receives an operation instruction output by a control unit to grab claw poles to be measured in sequence and removes measured claw poles on the claw-pole overall magnetic property measurement unit. The claw-pole overall magnetic property measurement unit outputs a control power supply to the claw-pole overall magnetic property measurement unit according to the instruction of the control unit, receives an induction current of the measured claw poles, and output a measurement result to the control unit.

12 Claims, 4 Drawing Sheets

(58) Field of Classification Search
USPC .......................................................... 324/228
See application file for complete search history.

ONLINE AUTOMATIC MEASUREMENT SYSTEM FOR INTEGRAL MAGNETIC PERFORMANCE OF CLAW POLE

TECHNICAL FIELD

This invention relates to a technology in the field of magnetic performance measurement for generators, in particular to an online automatic measuring system of the magnetic properties for claw-pole.

BACKGROUND TECHNOLOGY

Claw-pole generator is the most commonly used type of automobile generator. Two claw-poles cooperate with each other to form the magnetic poles of the rotor. They are magnetized under the excitation of the magnetizing winding and then generate a strong magnetic field. The rotor is rotated and cut the exitation coil to induce voltage and generate electricity. Improving the magnetic properties of claw-pole parts can directly improve the generation efficiency of claw-pole generator at the same rotation rate. In practice, there are many different manufacturing processes and raw materials for claw-pole. How to measure and evaluate the overall magnetic properties of claw-pole and guide the optimization of its manufacturing process and raw material composition is of great significance. Therefore, it is urgent to develop a measuring system of the magnetic properties for claw-pole. For industrial mass production, the quality of claw-pole parts can be controlled more effectively by realizing online automatic measurement.

SUMMARY OF THE INVENTION

In view of the defect that the existing technology can not realize the online automatic measurement of the overall magnetic performance of the claw-pole, the invention proposes an online automatic measurement system of the overall magnetic performance of the claw-pole, which greatly improves the detection efficiency of the claw-pole parts through the automatic detection process.

The invention is realized by the following technical scheme:

The invention relates to an online automatic detection system for the overall magnetic properties of claw-poles, which includes the feeding part, the measuring unit for the overall magnetic properties of claw-poles, the discharging part and the manipulator arranged therein. The manipulator receives the operation instructions from the control unit to grab the claw-poles to be measured on the feeding part and move them out of the measuring unit in turn. The measuring unit for the overall magnetic properties of claw-poles outputs control power to the measuring unit, receives the induced current of the measured claw-pole and outputs the test results to the control unit according to the instructions from the control unit.

The measuring unit for the overall magnetic properties of claw-poles includes a support base, a winding ferrule and a claw-pole handling device arranged on the support base from inside to outside and a DC magnetic performance measurement instrument. The measured claw-pole is positioned and detached from the support base through the handling device. The winding ferrule is provided with measuring coil and magnetizing winding connected with the DC magnetic performance measurement instrument, and the measuring coil is located inside the measured claw-pole. A conducting ring is set outside the measured claw-pole to form a magnetic field loop with the measured claw-pole. The DC magnetic performance measuring instrument outputs control power to the measuring unit for the overall magnetic properties of claw-poles according to the instructions of the control unit. The magnetizing winding receives the excitation voltage from the DC magnetic performance measuring instrument, and the measuring coil generates and transmits the induced current to the DC magnetic performance measuring instrument. The output excitation current is recorded by the DC magnetic performance measuring instrument. The detected induction current is converted to the induction voltage, and the magnetic induction intensity is calculated through integrating the voltage in the time domain Then, the whole magnetization curve of the claw-pole part to be measured is obtained to characterize the magnetic conductivity of the claw-pole part.

When the magnetizing winding is fed into the excitation current I, the magnetic field is generated through electromagnetic induction, and the corresponding external magnetic field strength is $H=N1 \times I/L_e$, where N1 is the number of turns of the magnetizing winding, $L_e$ is the equivalent magnetic circuit length. After measuring the induced electrical signal generated in the exitation coil, the induction current is calculated by the electronic integrator, and then the induction magnetic flux Φ induced in the coil is calculated. As the external magnetic field strength increases, the corresponding magnetic induction intensity is calculated to be $B=\Phi/(N2 \times A_e)$, where N2 is the number of turns of magnetizing winding, $A_e$ is the equivalent cross-section area.

The claw-pole handling device comprises a positioning axis set inside the support base and a hydraulic cylinder connected with the positioning axis. A magnetic conducting pad is arranged on the positioning axis, which is located between the support base and the measured claw-pole, and the positioning and detachment of the measured claw-pole and the support base are realized by driving the lifting of the positioning axis through the hydraulic cylinder.

The positioning axis is a ladder-shaped structure for ensuring the coaxiality between the measured claw-pole and the central boss of the support base. The joint surface of the large end and the small end of the positioning axis contacts the lower end surface of the ring magnetic conducting pad, and the diameter of the large end matches the inner diameter of the central hole of the measured claw-pole, and the diameter of the small end matches the inner diameter of the ring magnetic conducting pad.

The outer diameter of the magnetic conducting pad is smaller than that of the center boss of the support base and the inner diameter is smaller than that of the inner hole of the measured claw-pole. The magnetic conducting pad has a taper preferably to facilitate assembly and disassembly.

An annular sleeve is arranged on the contact surface between the positioning axis and the measured claw-pole. The inner diameter of the annular sleeve matches the outer diameter of the small end of the positioning axis and the outer diameter matches the inner diameter of the central hole of the measured claw-pole.

The winding ferrule is provided with upper and lower spaces. The smaller upper space is used for winding measuring coil s, and the larger lower space is used for winding magnetizing windings. The inner diameter of the winding ferrule in the lower end is in clearance fit with the outer diameter of the center boss of the support base.

The support base is set with a magnetic isolation pad in the bottom, and the thickness is larger than 1.5 times of the support base thickness.

The feeding part adopts, but is not limited to, a conveyor belt for carrying the claw-pole to be measured.

The discharging part includes two conveyor belts for carrying qualified claw-poles and unqualified claw-poles respectively, and the conveyor belt with qualified claw-poles coincides with the starting end of the conveyor belt with defective claw-poles.

The manipulator is preferred to have overturning function. The manipulator clamps the claw-pole to be measured from the feeding conveyor belt into the measuring device of the magnetic performance for the claw-pole in turn by receiving the instructions from the control unit, and waits for the signal from the control unit to clamp the tested claw-pole to the discharging conveyor belt.

The control unit comprises the central controller, the manipulator controller and driver, the conveyor belt controller and driver, the claw-pole handling controller and driver. The central controller is respectively connected with the manipulator controller, the DC magnetic performance measuring instrument, the conveyor belt controller and the claw-pole handling controller and sends out control signals to them. The DC magnetic performance measuring instrument transmits the measurement results to the central controller to achieve orderly detection and classification.

TECHNICAL EFFECT

Compared with the existing technology, the invention realizes the non-destructive detection of claw-pole parts. It can be matched with the existing production line of claw-pole parts to realize automatic online detection.

Figure 1:
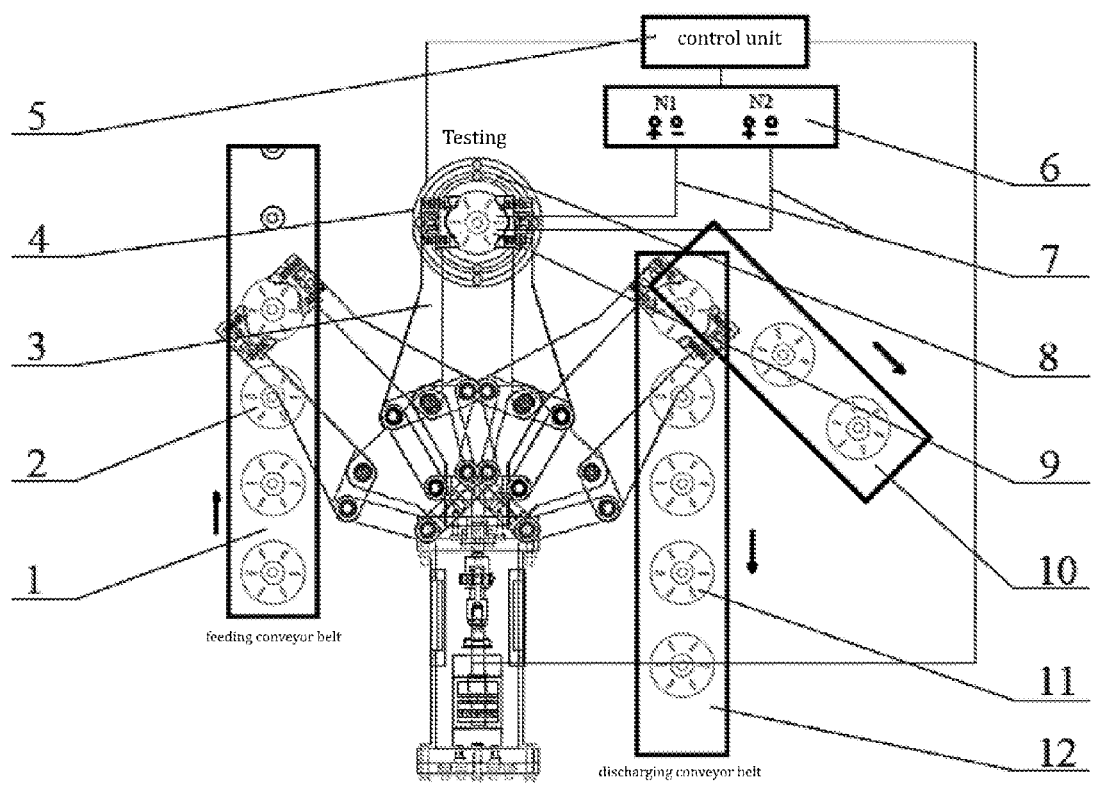
FIG. 1 is a top view of the invention.

In the picture: Feeding conveyor belt 1, claw-pole part to be measured 2, manipulator 3, claw-pole handling device 4, control unit 5, DC magnetic performance measuring instrument 6, out-leading of measuring coil and magnetizing winding 7, measuring unit for the overall magnetic properties of claw-poles 8, magnetic isolation pad 8-1, support base with central circular boss 8-2, magnetizing winding 8-3, conducting ring 8-4, measuring coil 8-5, annular sleeve 8-6, magnetic conducting pad 8-7, winding ferrule 8-8, positioning axis 8-9, hydraulic cylinder and driver 8-10, claw-pole part to be measured 9, output belt for unqualified products 10, qualified claw-pole 11, Discharge conveyor belt 12.

Specific Implementation Method

FIG. 1 presents the online automatic measuring system of the magnetic properties for claw-pole described in this embodiment, which includes feeding conveyor belt 1 as feeding part, manipulator 3 with overturning function, claw-pole handling device 4, control unit 5, measuring unit for the overall magnetic properties of claw-poles 8, unqualified products output belt 10 and discharging conveyor belt 12 as discharging part. The manipulator receives the operation instructions from the control unit to grab the claw-poles to be measured on the feeding part and move them out of the measuring unit in turn. The measuring unit for the overall magnetic properties of claw-poles outputs control power to the measuring unit, receives the induced current of the claw-pole to be measured and outputs the test results to the control unit according to the instructions from the control unit.

Figure 2:
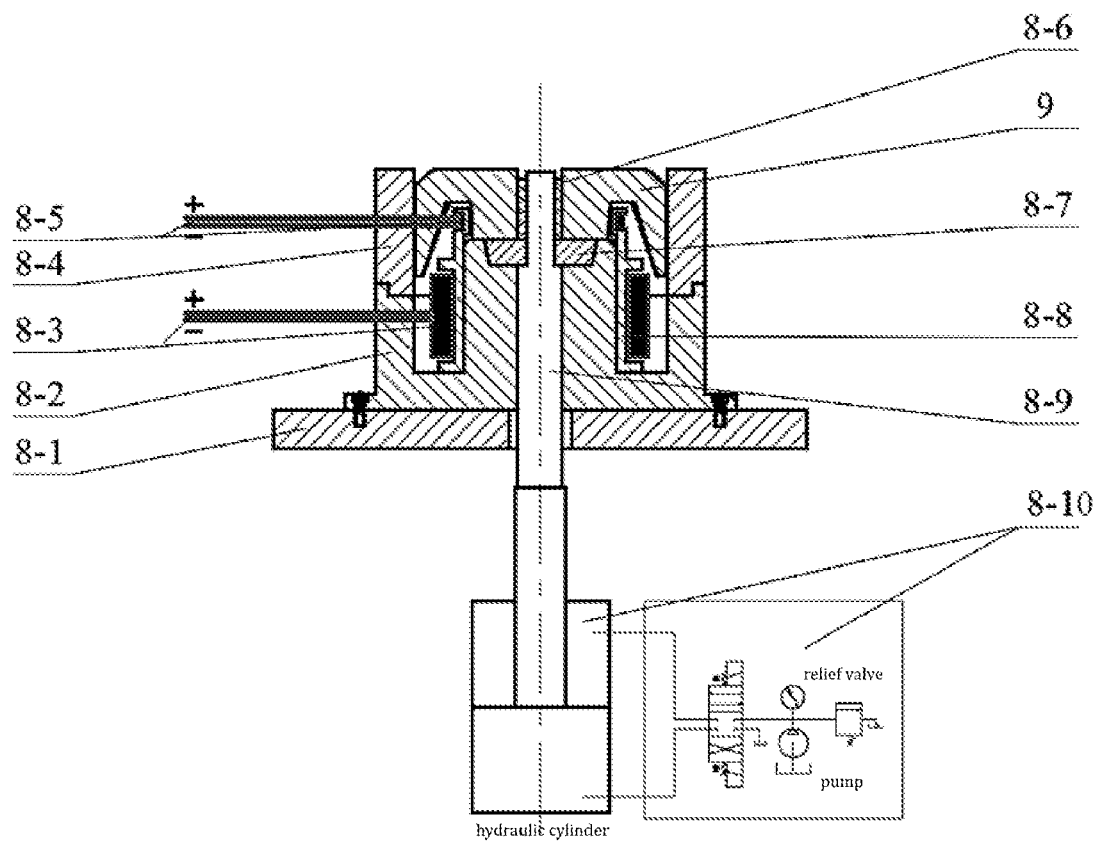
FIG. 2 shows a schematic diagram of the measuring unit for the overall magnetic properties of claw-poles.

As shown in FIG. 2, the measuring unit for the overall magnetic properties of claw-poles 8 includes a support base 8-2 with a central circular boss, magnetizing winding 8-3 and measuring coil 8-5 arranged on the winding ferrule 8-8 and connected with the DC magnetic performance measurement instrument 6, conducting ring 8-4 set outside the claw-pole to be measured 9, and claw-pole handling device.

Figure 3:
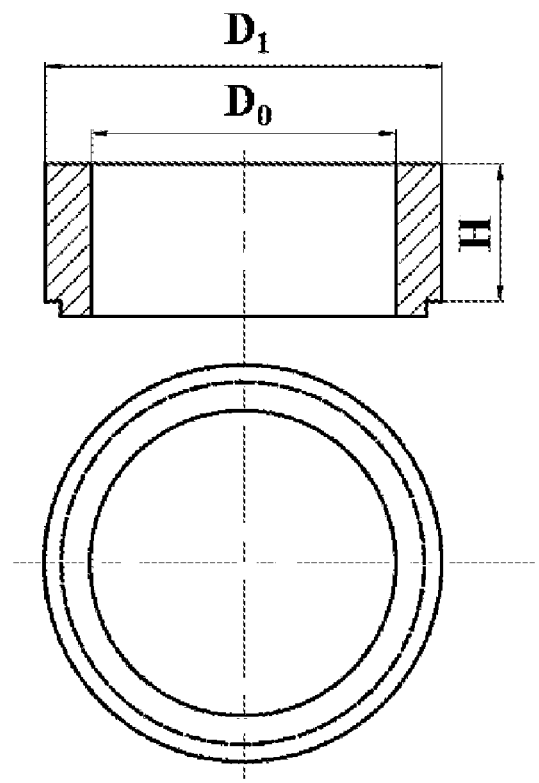
FIG. 3 shows a schematic diagram of the conducting ring.

As shown in FIG. 3, the total height of the conducting ring 8-4 is 1.1~1.2 times that of the claw-pole part to be measured. The difference between the inner diameter of conducting ring 8-4 $D_0$ and the outer diameter of the claw-pole part is 0.4~0.8 mm, and the outer diameter of the conducting ring 8-4 is $$D_1 = \sqrt{\frac{\kappa S_{claw\ pole}}{\pi} + D_0^2},$$

where $S_{claw\ pole}$ is the cross-sectional area of the central boss of the claw-pole part, $\kappa = 10$~$12$.

The conducting ring 8-4 is provided with a step structure in the bottom for matching with the support base. The conducting ring is made of a ferromagnetic material with high permeability and high saturation magnetic induction intensity. The function of the conducting ring 8-4 is mainly to form a magnetic field loop with the claw-pole to be measured.

The outer diameter of the claw-pole to be measured in this implementation is 98.7 mm, so the inner diameter of the conducting ring is 98.7+0.3×2=99.3 mm, and the outer diameter is 99.3+15×2=129.3 mm.

Figure 4:
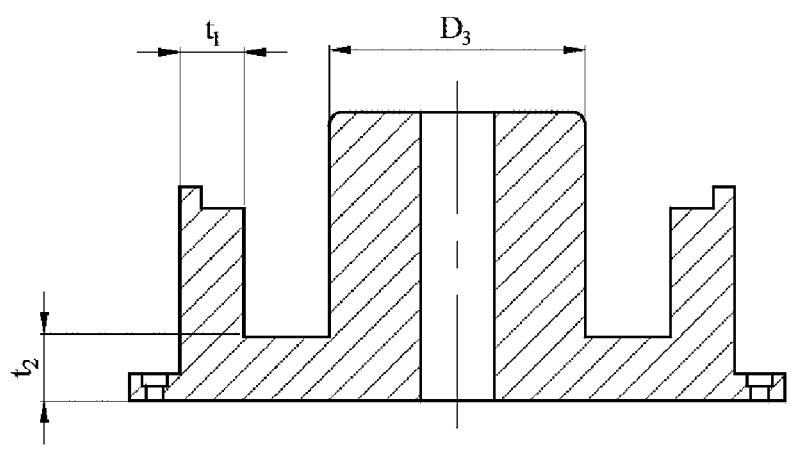
FIG. 4 shows a schematic diagram of the support base.
Figure 5:
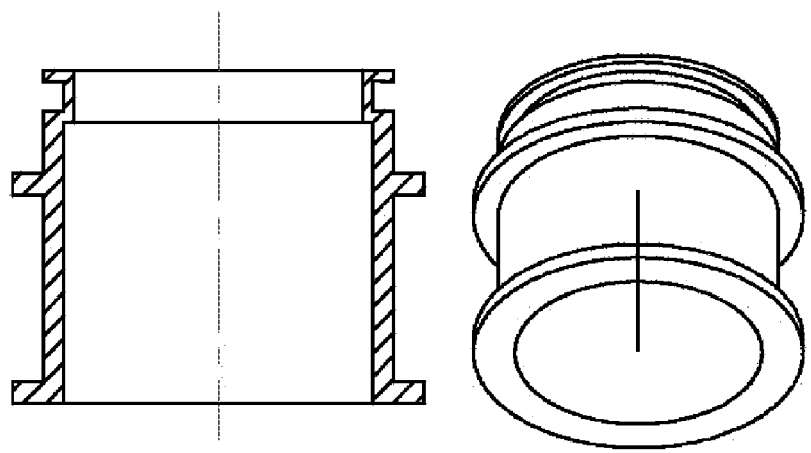
FIG. 5 shows a schematic diagram of the winding ferrule.

As shown in FIG. 4, the diameter of the intermediate through hole in the support base 8-2 matches the diameter of the central hole of the claw-pole part. The diameter of the central boss is 3-5 mm larger than that of the claw-pole boss. The thickness $t_1$ of the outer ring matches the thickness of the conducting ring, and the thickness $t_2$ of the bottom is more than 1.5 times that of the outer ring. The support base is connected with the bottom magnetic isolation pad with bolts. The support base is made of ferromagnetic material with high permeability and saturated magnetic induction intensity.

The taper of the magnetic conducting pad 8-7 is 8°.

The winding ferrule 8-8 is provided with upper and lower spaces. The smaller upper space is used for winding measuring coil s, and the larger lower space is used for winding magnetizing windings. The inner diameter of the winding ferrule in the lower end is in clearance fit with the outer diameter of the center boss of the support base, and the winding ferrule is made of paramagnetic material.

The winding method of the coil on the winding ferrule 8-8 is as follows. The copper wire is uniformly wound onto the lower space in the same direction to work as the magnetizing winding, and wire is wound on the upper space as the measuring coil.

The turns number of the magnetizing winding 8-3 is 1.1~1.2 times as many as the winding turns number of the magnetizing winding needed for the claw-pole to be measured in the actual use of the motor. The maximum turns number of the corresponding measuring coil 8-5 is $$n_{max} = \frac{\varphi_{max}}{2 \times B_{max} \times S},$$

where $\phi_{max}$ is the maximum measurable magnetic flux of the testing device, $B_{max}$ is recommended as 2.0 Tesla, S is the cross-sectional area of the middle boss of the claw-pole to be measured. The measuring range is set to 1500 ampere turns. The magnetizing winding in the claw-pole generator rotor corresponding to the claw-pole to be measured is 360 turns, so in order to be safe, the magnetizing winding on the winding ferrule is set to be 400 turns. The maximum magnetic flux range of the DC magnetic performance measuring instrument is 0.8 mwb, the maximum magnetic flux density of the claw-pole to be measured is estimated to be 2.1 T, and the cross-sectional area of the claw-pole boss is 1900 mm$^2$, so the maximum turns number of the measuring coil is calculated to be 2.5 turns. In order to ensure the safety of the measuring instrument, the turns number of the measuring coil is selected as 2 turns. The excitation current output by DC magnetic performance measurement instrument is set to be 3.75 A.

The test steps of the device are as follows:

During testing, the relevant parameters in DC magnetic performance measuring instrument 6 are set according to the type of the claw-pole to be tested, including effective cross-section area 1900 mm$^2$, magnetizing winding turns 400 turns and measuring coil turns 2 turns. The claw-pole 2 to be measured is placed in the positioning groove for claw-pole of the feeding conveyor belt 1. The driver of hydraulic cylinder 4 of the claw-pole handling device is reset. The classification scheme of measurement results is set up in control unit 5. The manipulator 3 with overturning function is reset to the initial position far from the magnetic performance measuring device, and then the whole system is opened to start operation.

Step 1: The manipulator 3 with overturning function clamps the claw-pole 2 to be measured from the predetermined position of the feeding conveyor belt 1 and puts it into the measuring unit for the overall magnetic properties of claw-poles 8 with ejection mechanism. The manipulator 3 with overturning function resets to the initial position and transmits the signal to the control unit 5. Meanwhile, the feeding conveyor belt sends the next claw-pole to the predetermined position.

Step 2: The control unit 5 receives the signal from the manipulator 3 with overturning function and opens the DC magnetic performance measuring instrument 6. The claw-poles to be measured are demagnetized and measured in DC magnetic performance measuring instrument 6 in turn. Up to the end of the measurement, the DC magnetic performance measuring instrument 6 transmits the measurement results to the control unit 5.

Step 3: The control unit 5 receives the measurement results and sends signals to the manipulator 3 with overturning function and hydraulic cylinder driver 4 of ejection mechanism according to the classification scheme set by the system.

Step 4: The driver 4 of the claw-pole handling device receives the signal from the control unit, drives the hydraulic cylinder and ejects the measured claw-pole.

Step 5: The control unit 5 receives the feedback signal from driver 4, and controls the manipulator 3 to clamp the measured claw-poles to the predetermined position of the discharging conveyor belt 12 or directly put them into the conveyor belt 10 for unqualified products. Then the manipulator 3 is reset, and the qualified products are delivered by the discharging conveyor belt to the next production process. The measurement results are shown in Table 1.

After the whole system is opened, the above-mentioned cyclic action is carried out to realize the online automatic measurement of the overall magnetic properties for claw-pole. The measuring time of each part can be adjusted by adjusting the measuring points of the DC magnetic performance measuring instrument, which is convenient for adapting to the production rhythm of the production line. By changing the classification scheme of the measurement results in the control unit, the function of screening according to the magnetic properties of the claw-poles can be realized.

TABLE 1

Measurement results of magnetic properties of claw-poles

| Serial number | Average magnetic induction intensity (3.75 A) | Qualified or not |
| --- | --- | --- |
| 1 | 1.894 | Unqualified |
| 2 | 1.901 | Qualified |
| 3 | 1.905 | Qualified |
| 4 | 1.902 | Qualified |
| 5 | 1.900 | Qualified |

The specific implementation of the above-mentioned proposal can be partially adjusted by the technical personnel in this field in different ways without departing from the principles and purposes of the invention. The protection scope of the invention is subject to the claim and is not limited by the above-mentioned specific implementation, and the implementation schemes within the scope of the invention are constrained by the invention.

What is claimed is:

1. An online automatic detection system for the overall magnetic properties of claw-poles comprising: a feeding part, a measuring unit for the overall magnetic properties of claw-poles, a discharging part and a manipulator arranged therein, in which the manipulator receives the operation instructions from the control unit to grab the measured claw-poles on the feeding part and move them out of the measuring unit in turn, and the measuring unit for the overall magnetic properties of claw-poles outputs control power to the measuring unit, receives the induced current of the measured claw-pole and outputs the test results to the control unit according to the instructions from the control unit; ferrule and a claw-pole handling device arranged on the support base from inside to outside and a DC magnetic performance measurement instrument, in which the measured claw-pole is positioned and detached from the support base through the handling device, and the winding ferrule is provided with measuring coils and magnetizing windings connected with the DC magnetic performance measurement instrument, and the measuring coil is located inside the measured claw-pole;

and a conducting ring is set outside the measured claw-pole to form a magnetic field loop with the measured claw-pole, and the DC magnetic performance measuring instrument outputs control power to the measuring unit for the overall magnetic properties of claw-poles according to the instructions of the control unit, and the magnetizing winding receives the excitation voltage from the DC magnetic performance measuring instrument, and the measuring coil generates and transmits the induced current to the DC magnetic performance measuring instrument, and the output excitation current is recorded by the DC magnetic performance measuring instrument, and the detected induction current is converted to the induction voltage, and the magnetic induction intensity is calculated through integrating the voltage in the time domain, and then, the whole magnetization curve of the claw-pole part to be measured is obtained to characterize the magnetic conductivity of the claw-pole part.

2. The online automatic detection system described in claim 1, it is characterized by the claw-pole handling device. It comprises a positioning axis set inside the support base and a hydraulic cylinder connected with the positioning axis, and a magnetic conducting pad is arranged on the positioning axis, which is located between the support base and the measured claw-pole, and the positioning and detachment of the measured claw-pole and the support base are realized by driving the lifting of the positioning axis through the hydraulic cylinder.

3. The online automatic detection system described in claim 1, in which the said positioning axis is a ladder-shaped structure for ensuring the coaxiality between the measured claw-pole and the central boss of the support base, and the joint surface of the large end and the small end of the positioning axis contacts the lower end surface of the ring magnetic conducting pad, and the diameter of the large end matches the inner diameter of the central hole of the measured claw-pole, and the diameter of the small end matches the inner diameter of the ring magnetic conducting pad.

4. The online automatic detection system described in claim 1, in which the said outer diameter of the magnetic conducting pad is smaller than that of the center boss of the support base and the inner diameter is smaller than that of the inner hole of the measured claw-pole.

5. The online automatic detection system described in claim 2, in which the said magnetic conducting pad has a taper to facilitate assembly and disassembly.

6. The online automatic detection system described in claim 1, in which an annular sleeve is arranged on the contact surface between the positioning axis and the measured claw-pole, and the inner diameter of the annular sleeve matches the outer diameter of the small end of the positioning axis and the outer diameter matches the inner diameter of the central hole of the measured claw-pole.

7. The online automatic detection system described in claim 1, in which the said winding ferrule is provided with upper and lower spaces, and the smaller upper space is used for winding measuring coil s, and the larger lower space is used for winding magnetizing windings, and the inner diameter of the winding ferrule in the lower end is in clearance fit with the outer diameter of the center boss of the support base.

8. The online automatic detection system described in claim 1, in which the said magnetic field is generated through electromagnetic induction when the magnetizing winding is fed into the excitation current I, and the corresponding external magnetic field strength is $H=N1 \times I/L_e$, where N1 is the number of turns of the magnetizing winding, $L_e$ is the equivalent magnetic circuit length. After measuring the induced electrical signal generated in the exitation coil, the induction current is calculated by the electronic integrator, and then the induction magnetic flux $\Phi$ induced in the coil is calculated; as the external magnetic field strength increases, the corresponding magnetic induction intensity is calculated to be $B=\Phi/(N2 \times A_e)$, where N2 is the number of turns of magnetizing winding, $A_e$ is the equivalent cross-section area.

9. The online automatic detection system described in claim 1, in which the said discharging part includes two conveyor belts for carrying qualified claw-poles and unqualified claw-poles respectively, and the conveyor belt with qualified claw-poles coincides with the starting end of the conveyor belt with defective claw-poles.

10. The online automatic detection system described in claim 1, in which the said manipulator have a overturning function, and the manipulator clamps the claw-pole to be measured from the feeding conveyor belt into the measuring device of the magnetic performance for the claw-pole in turn by receiving the instructions from the control unit, and waits for the signal from the control unit to clamp the tested claw-pole to the discharging conveyor belt;

and the control unit comprises the central controller, the manipulator controller and driver, the conveyor belt controller and driver, the claw-pole handling controller and driver, and the central controller is respectively connected with the manipulator controller, the DC magnetic performance measuring instrument, the conveyor belt controller and the claw-pole handling controller and sends out control signals to them, and the DC magnetic performance measuring instrument transmits the measurement results to the central controller to achieve orderly detection and classification.

11. The online automatic detection system described in claim 3, in which the said magnetic conducting pad has a taper to facilitate assembly and disassembly.

12. The online automatic detection system described in claim 4, in which the said magnetic conducting pad has a taper to facilitate assembly and disassembly.

* * * * *